United States Patent [19]

Miyo

[11] Patent Number: 4,651,104
[45] Date of Patent: Mar. 17, 1987

[54] FREQUENCY CONVERTER WITH AUTOMATIC FREQUENCY CONTROL

[75] Inventor: Tokihiro Miyo, Kawasaki, Japan

[73] Assignee: Fujitsu Limited, Kawasaki, Japan

[21] Appl. No.: 510,182

[22] Filed: Jul. 1, 1983

[30] Foreign Application Priority Data

Jul. 7, 1982 [JP] Japan ............................. 57-117990
Sep. 30, 1982 [JP] Japan ............................. 57-172164

[51] Int. Cl.$^4$ ................... H03L 7/00; H04B 11/16; H03B 1/00

[52] U.S. Cl. ............................. 328/139; 328/15; 455/192; 455/258; 331/1 R; 307/271

[58] Field of Search ............... 328/15, 133, 139, 140; 307/219.1, 261, 271; 331/1 R, 1 A, 25, 32, 34; 455/164, 192, 255, 258

[56] References Cited

U.S. PATENT DOCUMENTS

| 3,204,185 | 8/1965 | Robinson | 331/1 R |
| 3,573,650 | 4/1971 | Maltese | 331/1 R |
| 3,727,149 | 4/1973 | Kimura | 331/1 R |
| 3,936,753 | 2/1976 | Clark | 455/192 |
| 3,940,554 | 2/1976 | Masuda | 455/192 |
| 4,023,114 | 5/1977 | Meixler | 331/1 A |
| 4,031,471 | 6/1977 | Noguchi | 331/1 A |
| 4,158,175 | 6/1979 | Toyomaki | 331/1 R |
| 4,206,425 | 6/1980 | Nossen | 331/1 A |
| 4,234,929 | 11/1980 | Riley, Jr. | 307/271 |

Primary Examiner—Stanley D. Miller
Assistant Examiner—Timothy P. Callahan
Attorney, Agent, or Firm—Staas & Halsey

[57] ABSTRACT

An automatic frequency control system for use in a frequency converter of a time division communication system, wherein the nonmodulated portion contained in the burst signal is selectively frequency discriminated. The frequency discriminated output is held for a certain period of time and then used as the oscillation frequency control signal of a local oscillating means.

9 Claims, 6 Drawing Figures

FREQUENCY CONVERTER WITH AUTOMATIC FREQUENCY CONTROL

CROSS REFERENCE TO RELATED APPLICATION

This application is related to U.S. Ser. No. 511,303, filed July 6, 1983 by the inventor of the present application, and assigned to the assignee of the present application.

BACKGROUND OF THE INVENTION

This invention relates to a frequency converter and more specifically to a frequency converter which keeps a frequency constant after frequency conversion.

Recently, a time division multiple access communication with a PSK (phase shift keying) modulated wave has been employed in the field of satellite communication. In this communication system, as in the case of other radio communication systems, a received radio frequency band signal is converted to the specified frequency by a frequency converter and thereafter this signal is demodulated. When the signal is demodulated, a frequency must be demodulated using a specified constant frequency of the circuit structure. If frequency fluctuation is large, data error occurs and accurate demodulation becomes difficult.

Accordingly, in existing communication systems, automatic frequency control of the received signal occurs by changing the oscillation frequency of a local oscillator to be used for frequency conversion in accordance with a frequency fluctuation of the received signal.

However, as is well known, the signal spectrum of the use of the above PSK modulated wave is widely spreading and therefore it is difficult to directly extract the reference signal of an AFC device from this PSK modulated wave. Namely, if deviation of received signal from the specific frequency cannot be recognized, it is impossible to effectuate AFC to this received signal.

In this case, therefore, it is proposed that the pilot signal, in which the relative frequency interval to the center frequency of the PSK modulated wave is kept constant, is transmitted in such a form that it is superimposed on the PSK modulated signal. Here, deviation from the specified frequency is identified with reference to the pilot signal having the line spectrum and AFC is effectuated on the received PSK modulated wave. However, in this method, the communication frequency band and transmission facilities are required because of the pilot signal, and thus it is not recommended to employ this method in a system such as a satellite communication system which is strongly restricted in the transmitting frequency band. Moreover, addition of the pilot signal transmission circuit results in increase of the cost of system and deterioration of the reliability thereof.

In radio communication systems, particularly in a low speed time division multiple access (TDMA) satellite communication system which is recently attracting much attention of those who are skillful in this art, it is very difficult to perfectly remove frequency fluctuation of the receiving signal and therefore it is necessary to provide an automatic frequency control system as explained above which does not use a pilot signal.

SUMMARY OF THE INVENTION

It is an object of this invention to provide a frequency converter which can easily control an oscillation frequency of a local oscillator without using a pilot signal described above and thereby maintain the frequency of the output signal at a constant value.

In the frequency converter of this invention, frequency discrimination is partly carried out only in the nonmodulated portion included in the burst signal of the TDMA communication system utilizing the PSK modulated wave, this frequency discriminator output is held for a certain period and the output is used as the oscillation frequency control signal of a local oscillator.

DESCRIPTION OF THE PREFERRED EMBODIMENTS

Figure 1:
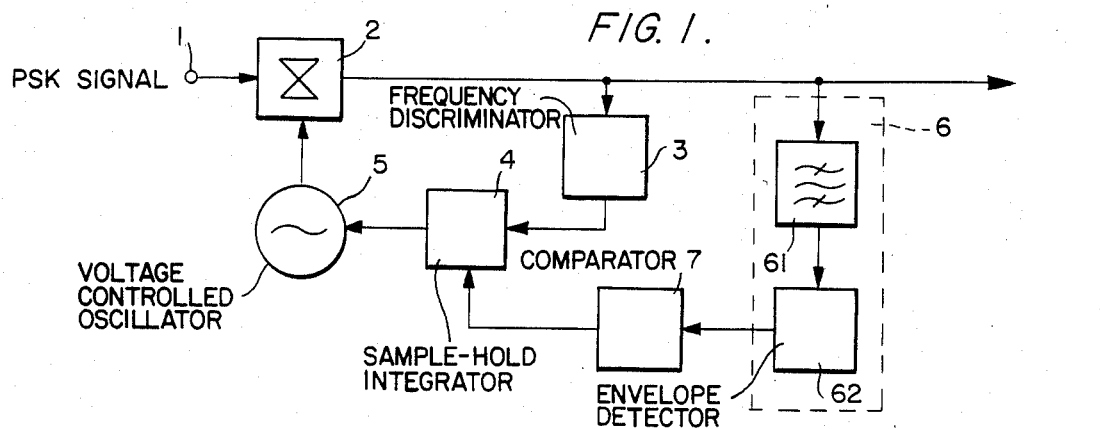
FIG. 1 is a block diagram of a frequency converter according to an embodiment of the present invention.

FIG. 1 is a block diagram of a frequency converter according to the present invention. In this figure, 1 is an input terminal to which the PSK input signal is applied, 2 is a mixing means, 3 is a frequency discriminating means, 4 is a sample-hold type integrating means, 5 is a voltage controlled oscillator, 6 is a means for extracting the nonmodulated portion comprising a band-pass-filter 61 and a means for detecting envelope 62.

Figure 2:
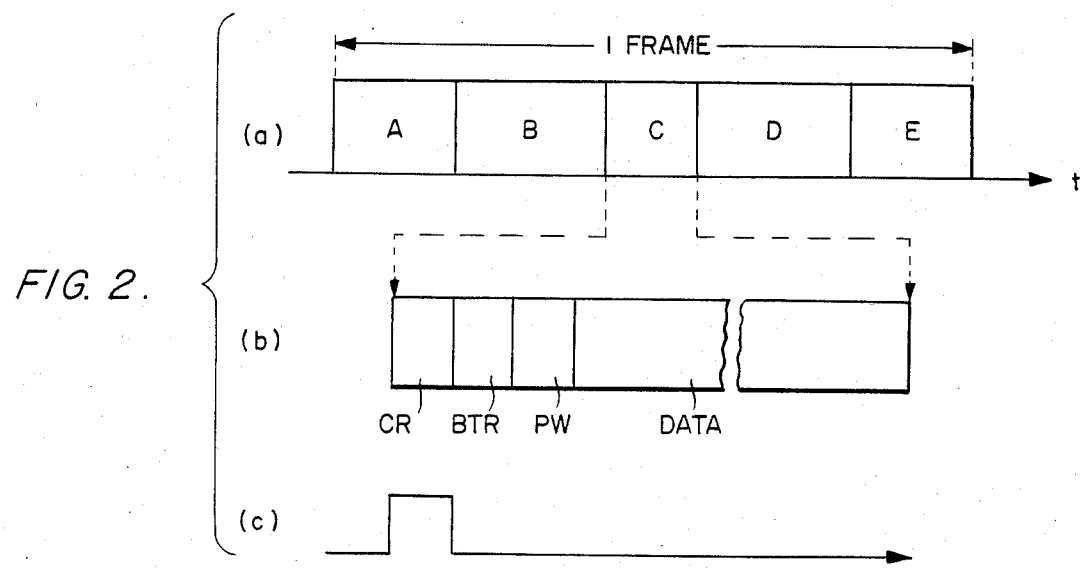
FIG. 2 shows a burst signal of a TDMA communication system using a PSK modulated signal for the circuit operations of the present invention.

The input terminal 1 is supplied with a burst signal input of the PSK modulated wave shown in FIG. 2(b). This burst signal is arranged in a line on the time axis as shown in FIG. 2(a), on the transporter of a satellite. The burst signals A-E, forming one frame, are respectively distributed to the slave stations (terrestrial stations) A-E on a time division basis. Each burst signal is diversified but basically employs the structure shown in FIG. 2(b). Namely, a burst signal is formed with the nonmodulated portion CR for triggering the reference carrier recovery circuit, BTR consisting of the patterns "1" and "0" for clock recovery, preamble word PW having a diversified control information, etc., and a data portion.

With a precondition that the burst signal, as explained above, is received, the operation of the circuit shown in FIG. 1 is explained hereafter.

The PSK modulated wave sent from the input terminal 1 is mixed with an output of the voltage controlled oscillator 5 in the mixing means 2 and the specified different frequency signal can be extracted. A signal, after frequency conversion, is input to the frequency discriminating means 3 and a frequency difference of the specified frequency is extracted as a DC voltage level. However, the PSK modulated wave modulated by the random signal generally does not include the carrier component (nonmodulated portion) and therefore, in this case, frequency error information cannot be obtained from an output of the frequency discriminating means 3. But, only the nonmodulated carrier is transmitted by the abovementioned nonmodulated portion CR. Accordingly, in this region, the specified frequency error information can be obtained from an output of the frequency discriminator 3.

On the other hand, in the means for extracting the nonmodulated portion 6, the nonmodulated portion in the burst signal is detected by the band-pass-filter 61 which allows the nonmodulated portion CR to pass and the means for extracting an envelope 62 detects an output signal of the filter 61 and outputs a DC voltage.

An output of the means for extracting envelope 62 is compared with the specified threshold voltage at the voltage comparator 7 and a pulse signal is output having a time width corresponding to the nonmodulated portion of the burst signal. This pulse signal is shown in FIG. 2(c) corresponding to the burst signal of FIG. 2(b).

As described above, since the specified frequency error information can be obtained from the frequency discriminating means 3 at the nonmodulated portion of the burst signal, a DC voltage proportional to a frequency error signal can be obtained by sample-holding an output of the frequency discriminating means 3 with the pulse signal obtained from the voltage comparator 7 (corresponding to the nonmodulated portion) and by integrating these values. The sample-holding and integrating processes are carried out in the sample-hold type integrating means 4, and an output of the integrating means 4 is input to the voltage controlled oscillator 5 as the oscillation frequency control signal.

An oscillation output of the voltage controlled oscillator 5 is frequency-controlled so that an output of the samle-hold type integrating means 4 becomes 0. Thereby, a frequency conversion output from the mixing means 2 has a constant frequency. In other words, the AFC operation is carried out.

Respective components of the frequency converter of this invention will now be explained. Since the mixing means 2, voltage controlled oscillator 5 and voltage comparator 7, are general purpose commercially available components, explanation of them is omitted.

Figure 3:
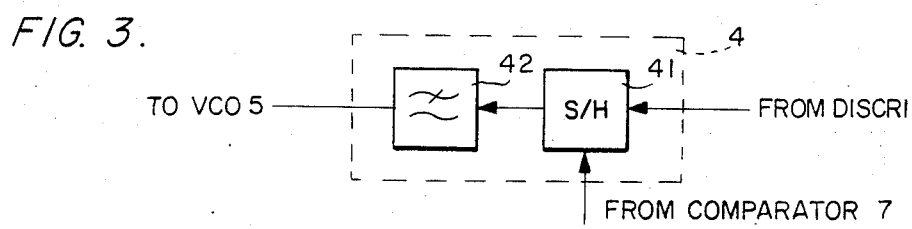
FIG. 3 is an embodiment of a sample-hold type integrating means used in the present invention.

FIG. 3 is a block diagram of the structure of sample-hold type integrating means 4. In this figure, 41 is a sample-hold circuit, and 42 is a low-pass-filter. Generally, the sample-hold type integrating means is formed and operated as a single circuit unit. The separate functions are indicated as the block structure shown in FIG. 3.

The sample-hold circuit 41 samples an output signal from the frequency discriminating means 3 with the pulse signal obtained from the voltage comparator 7, then holds such value and provides it as an output during the period of time until the pulse signal is input again. A low-pass-filter 42 extracts a DC component of an output of the sample-hold circuit 41 and outputs it as a control signal to the voltage controlled oscillator 5.

Figure 4:
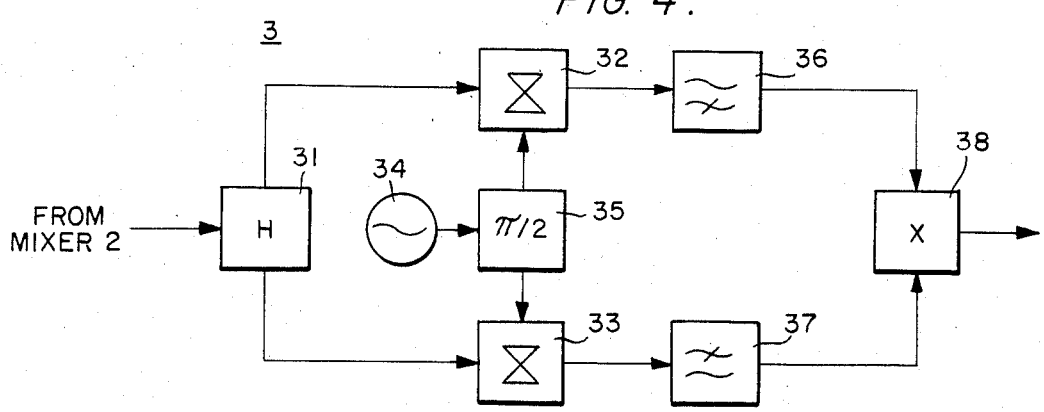
FIG. 4 is an embodiment of a frequency discriminating means used in the present invention.

FIG. 4 is a block circuit diagram of an example of structure of the the frequency discriminating means 3. This circuit shown in FIG. 4 is particularly structured for the purpose of (1) changing frequency discriminating sensitivity, and
(2) ensuring the discriminating sensitivity does not become zero even when a frequency exceeds the cut-off frequency. Therefore a cut-off frequency is lower than the pull-in frequency range of the AFC. The frequency discriminating means described herein provides the characteristics (1) and (2) indicated above and therefore, if the transmission rate of data changes, accordingly, the pull-in frequency range of the AFC changes.

When it is required to improve a limit of S/N which assures AFC operation, the above-mentioned frequency discriminating means can be effectively adopted. However, if the above-mentioned characteristics are not required, an existing resonant type frequency discriminating means can be used.

In FIG. 4, 31 is a hybrid circuit which divides the signal sent from the mixing means 2 into two routes, 32 and 33 are mixing means, 34 is an oscillator, 35 is a 90° hybrid circuit giving a phase difference of $\pi/2$ with respect to the output from the oscillator 34, 36 and 37 are high-pass and low-pass filters, respectively which have the same cut-off frequency and the same transfer function order, and 38 is a multiplier.

An output signal from the mixing means 2 is divided into two routes by the hybrid circuit 31 and then respectively mixed in the mixing means 32 and 33 with the local oscillation signals having a phase difference of 90°. Accordingly, beat signals having a phase difference of 90° can be obtained from the mixing means 32 and 33.

Figure 5A:
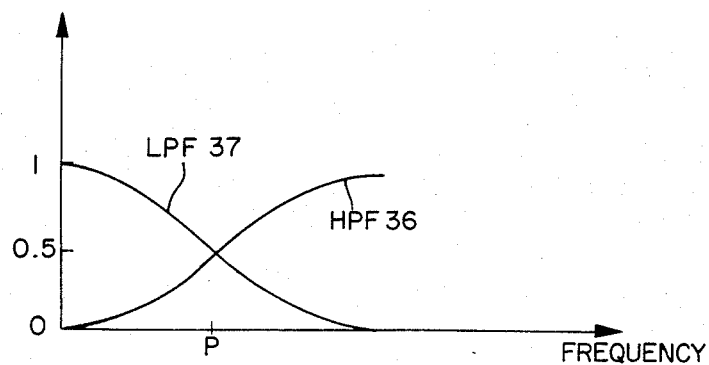
FIG. 5 is a graph of the characteristic of the frequency discriminating means shown in FIG. 4 and its components.

FIG. 5(a) is a graph of the first characteristic of a high-pass-filter 36 and low-pass-filter 37 in FIG. 4. Here, the first characteristic is the amplitude-frequency characteristic. In this figure, LPF 37 and HPF 36 respectively show the first characteristic curves of the high-pass-filter and low-pass-filter.

In FIG. 5(a), an amplitude is normalized to 1 and 0.5. When the frequency is 0 LPF 37 is 1, and HPF is 0. On the contrary, when the frequency becomes high, LPF 37 converges to zero and HPF converges to 1. Here, it should be noted that both LPF 37 and HPF 36 have the same cut-off frequency P (amplitude 0.5). By determining the same cut-off frequency as explained above, an almost cubic curve having a constant DC voltage $\Delta V_{dc}$, corresponding to the extreme values of $+0.25$ and $-0.25$ ($0.25=0.5\times0.5$) for the frequency of $f_r+P$, and $f_r-P$ can be obtained as the discriminating characteristic shown in FIG. 5(c).

The second characteristic of the filters is now described.

Figure 5B:
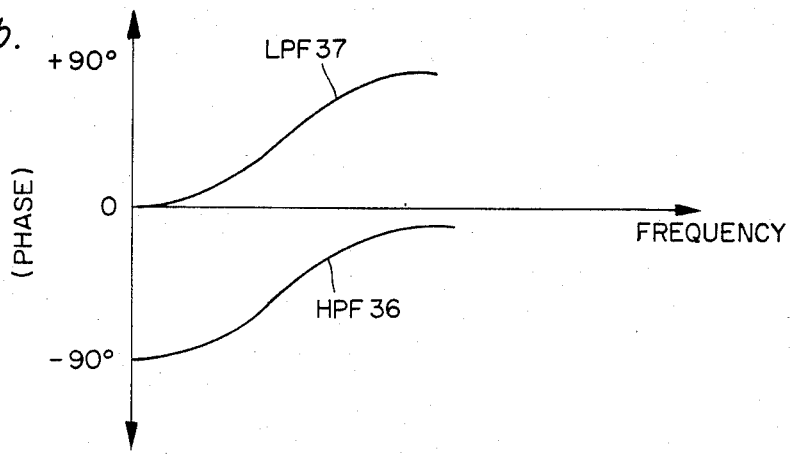

FIG. 5(b) is a graph of the second characteristic of the high-pass-filter 36 and low-pass-filter 37 in FIG. 4. Here the second characteristic is the phase-frequency characteristic. In this figure, HPF 36 and LPF 37 are, respectively, second characteristic curves of the high-pass-filter and low-pass-filter 36 and 37.

The HPF 36 provides a frequency of 0 and a phase of $-90°$. When the frequency increases, the phase converges to zero. On the contrary, LPF 37 provides a phase of 0 when the frequency is 0 and when the frequency increases, the phase converges to $+90°$. From the characteristic of FIG. 5(b), both the HPF 36 and LPF 37 change in phase irrespective of the frequency. This corresponds to the an output phase of mixing means 32 being shifted using a differential circuit, and set to the same phase as an output of the mixing means 33.

Namely, when an output of the oscillator 34 is considered as $f_{r'}$, an input signal as $f_{m'}$, and the frequency error information between them as $\Delta w(=f_r-f_m)$, an output of the mixing means 32 is proportional to sin ($\Delta wt$), while an output of the mixing means 33 is proportional to cos ($\Delta wt$), respectively. But, by the structure of FIG. 4, an output of the mixing means 32 is equivalently differentiated and an output proportional to $\Delta w\cdot\cos (\Delta w't)$ can be obtained, while at the multiplier 38, an output proportional to $\Delta w\cdot\cos (\Delta w't)\times\cos (\Delta w't)=\Delta w\{1+\cos 2(\Delta w't)\}$ can be obtained. Above $\Delta w'$ indicates a frequency error information when Δw is shifted by the high-pass-filter 36 and low-pass-filter 37. In addition, each output of the mixing means 32 and 33 is respectively input to the filters 36 and 37 with a phase difference of 90° and thereafter, as shown in FIG. 5(b), this output is given a phase difference of 90° and then output from the filters. Accordingly, all the signals input to the multiplier 38 have the same phase.

As a result, a frequency error information Δw can be detected as a DC voltage level $\Delta V_{dc}$ by extracting a DC component from the output $\Delta w\{1+\cos 2(\Delta w't)\}$ of the multiplier 38.

Figure 5C:
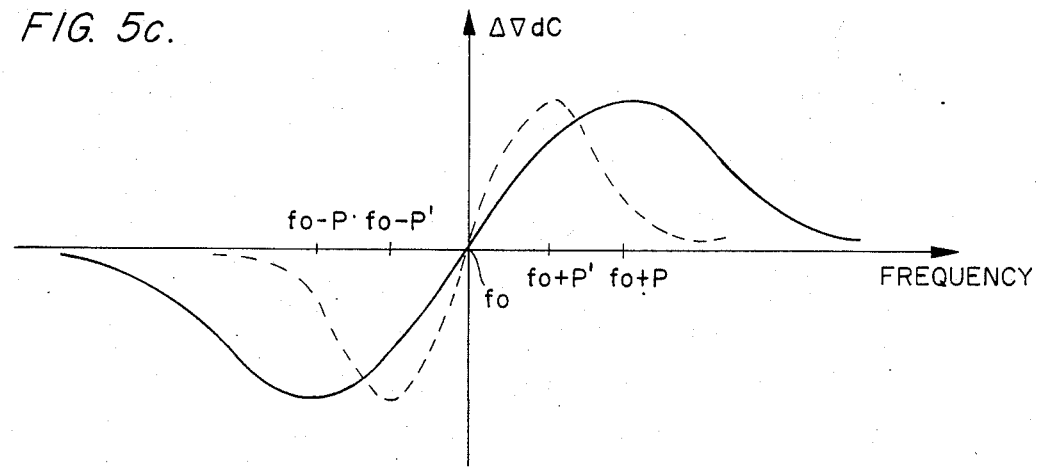

FIG. 5(c) is a graph of the output characteristic of the multiplier in FIG. 4. In this figure, the horizontal axis indicates the frequency (frequency after frequency conversion), while the vertical axis, indicates a DC voltage $\Delta V_{dc}$. Here, the first characteristic shows that even if the frequency exceeds $f_r+P$ (P is a cut-off frequency) or $f_r-P$, $\Delta V_{dc}$ does not immediately change to zero, it gradually reaches zero with a constant band width. This means that the discrimination sensitivity is not eliminated even when the cut-off frequency P is set to a lower value and therefore the pull-in frequency range of the AFC can be relatively widened. Thus, a limit of S/N, assuring the AFC operation, can be improved. The second characteristic shows that in case the cut-off frequency P is shifted to P', an almost cubic curve is maintained while $\Delta V_{dc}$ is kept constant. As explained with reference to FIG. 5(a), $\Delta V_{dc}$ is maintained constant because the cut-off frequency P of the high-pass-filter 36 and the low-pass-filter 37 are set equally (the normalized amplitude value is 0.5). That is, $\Delta V_{dc}$ is kept constant and corresponds to a constant value of $0.25(0.5\times0.5)$. As a result, the gradient of the almost linear part of the dotted line curve (cut-off frequency of P') becomes sharp (discrimination sensitivity becomes high) as compared with the gradient of the linear part of the solid line curve (cut-off frequency of P) shown in FIG. 5(c). When a discrimination sensitivity can be adjusted, data transmission can efficiently follow a change of transmission rate.

Figure 6:
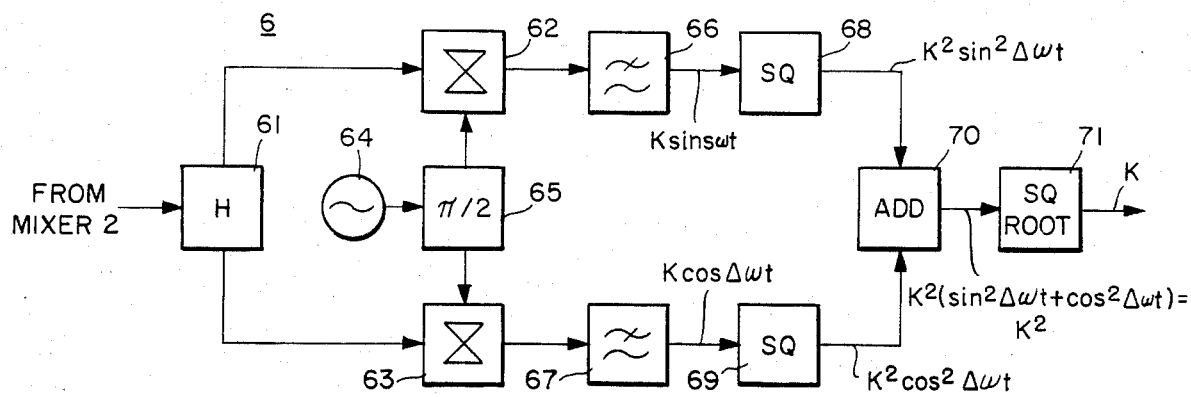
FIG. 6 is a non-modulated portion extracting means used in an embodiment of the present invention.

FIG. 6 is an example of the structure of the means 6 for extracting the nonmodulated portion. The means 6 for extracting the nonmodulated portion has a band pass filter 61 (BPF 61), which allows only the specified frequency signal to pass, and a means 62, for extracting an envelope, connected in series. In addition, this circuit is structured so that the center frequency of the band pass filtering characteristic is easily matched to the specified non-modulated portion and the pass-band width can also be changed easily. In the existing circuit structure, that is, a structure having only a band-pass-filter and a detector connected in series, the center frequency and band width can be changed only by changing a band-pass-filtering characteristic of the band-pass-filter, which is very difficult.

Operation of the means for extracting the non-modulated portion shown in FIG. 6 will now be described. In FIG. 6, 61 is a hybrid means, 64 is a local oscillating means, 65 is a 90° hybrid means, 62 and 63 are mixing means, 66 and 67 are low-pass-filters, 68 and 69 are square circuits, 70 is an adder, and 71 is a square root circuit. An output signal from the mixing means 2 (FIG. 1) is branched into two kinds of signals by the hybrid means 61 and these are respectively applied to the first input terminals of the mixing means 62 and 63. The second terminals of mixing means 62 and 63 are supplied with the output signals of the local oscillating means 64 with quadrature phase. Therefore, outputs of the mixing means 62 and 63 from which harmonics are removed by the low-pass-filters 66 and 67 respectively, correspond to K sin Δwt and K cos Δwt. Here, K is a constant proportional to the amplitude of the input signal, Δw is a frequency error information between the output $f_r$ and input $f_m$ of the oscillating means 64, as in the case of FIG. 4. The outputs of the low-pass-filters 66 and 67 are squared by the square circuits 68 and 69 and thereby the signals corresponding to $K^2 \sin^2 \Delta wt$ and $K^2 \cos^2 \Delta wt$ can be obtained. The signals obtained from the square circuits 68 and 69 are added in the adder 70 and thereby an output proportional to $K^2(\sin^2 \Delta wt + \cos^2 \Delta wt)$ is obtained. Here, from a result of $(\sin^2 \Delta wt + \cos^2 \Delta wt)=1$, a signal corresponding to the square value of input signal amplitude $K^2$ can be obtained from the adder 70. Thereafter, the square root circuit 71 executes operation of $\sqrt{K^2}=K$ and thereby an output corresponding to an amplitude of the input signal can be obtained.

As described above, according to the means 6 for extracting the nonmodulated portion, the oscillation frequency of the oscillator 64 is set to the center frequency of the band-pass characteristic and its bandwidth is determined by the filtering characteristic of the low-pass-filters 66 and 67. Accordingly, the characteristics can be adjusted easily.

In the circuit structure shown in FIG. 6, the square circuits 68 and 69 are used but these can be replaced with absolute value means. Here, the absolute values of K sin Δwt, and K cos Δwt, which are outputs of the low-pass-filters 66 and 67, are obtained. The double components of each signal are extracted therefrom, and a sum of these values is obtained. As a result, a DC component K', corresponding to the amplitude of the input signal, can be obtained. An output of the adder circuit 70 contains a DC component greater than K' and simultaneously a quadruple component of sin Δwt. Therefore, it is desirable to provide, in successive stages, adequate circuits for waveform shaping and level shifting in place of the square root circuit 71.

As is obvious from comparison between the means 6 for extracting the nonmodulated portion shown in FIG. 6 and the frequency discriminating means 3 shown in FIG. 4, the preceding stage of the mixing means 62 and 63 (32, 33) for quadrature detection in both circuits is composed of the same circuit structure. Therefore, the circuit in the preceding stage of the mixing means of both circuits can be used in common and thereby the cost of a frequency converter as a whole can be reduced.

As described above, according to this invention, an oscillation frequency of a voltage controlled oscillator can be changed easily in accordance with the fluctuation of the input signal frequency without using a particular pilot signal. Thereby, the communication frequency band can be used effectively and high reliability of the system can be obtained through prevention of system down due to abnormal phenomenon at the particular station from which the pilot signal is transmitted.

I claim:

1. A frequency converter operatively connected to receive a modulated burst signal, including a non-modulated portion, from a time division multiple access communication system, said frequency converter comprising:

first mixing means, operatively connected to receive the burst signal from the time division multiple access communication system and to receive a locally generated signal, for mixing the burst signal with the locally generated signal so as to convert the frequency of the burst signal and outputting an output frequency signal having a non-modulated portion;

discriminating means, operatively connected to said mixing means, for discriminating the frequency of the output frequency signal from said first mixing means and providing an output signal proportional to a predetermined error frequency component, said discriminating means comprising:

hybrid means, operatively connected to said first mixing means, for receiving the output frequency signal from said first mixing means and for dividing the output frequency signal into first and second output signals;

second mixing means, operatively connected to said hybrid means, for mixing the first and second output signals with the locally generated signal in phase quadrature with each other to provide first and second mixed output signals;

a high-pass-filter, operatively connected to said second mixing means, for receiving said first mixed output signal and filtering the first mixed output signal of said second mixing means;

a low-pass-filter, operatively connected to said second mixing means, having a cut-off frequency and transfer function order the same as said high-pass-filter, for receiving said second mixed output signal of said second mixing means and filtering the second mixed output signal; and multiplier means, operatively connected to said high-pass-filter and said low-pass-filter, for multiplying the first and second filtered output signals of said high-pass-filter and said low-pass-filter and providing an error frequency component;

means, operatively connected to said mixing means, for extracting an envelope of the non-modulated portion of the output frequency signal from said first mixing means and providing a control signal corresponding to the non-modulated portion;

integrating means of a sample-hold type, operatively connected to said discriminating means and said means for extracting an envelope, for integrating the output signal of said discriminating means and holding the output level under the control of said control signal from said means for extracting an envelope of the non-modulated portion and providing an integrated signal; and a voltage controlled oscillator, operatively connected to said integrating means, for receiving the output signal from said integrating means as a frequency controlled signal and for generating said locally generated signal.

2. A frequency converter, according to claim 1, wherein said integrating means comprises:

sample-hold means, operatively connected to said discriminating means and said means for extracting an envelope, for sampling and holding said control signal from said means for extracting an envelope of the nonmodulated portion and outputting an output signal; and a low-pass-filter, operatively connected to said sample-hold means, for filtering the output signal of said sample-hold means and providing a DC signal as the integrated signal from said integrating means to said voltage controlled oscillator.

3. A frequency converter, according to claim 1, wherein said discriminating means and said means for extracting an envelope of the nonmodulated portion commonly include said hybrid means and said second mixing means, connected to said hybrid means, for common use.

4. A frequency converter operatively connected to receive a modulated burst signal, including a non-modulated portion, from a time division multiple access communication system, said freqency converter comprising:

first mixing means, operatively connected to receive the burst signal from the time division multiple access communication system and to receive a locally generated signal, for mixing the burst signal with the locally generated signal so as to convert the frequency of the burst signal and outputting an output frequency signal having a non-modulated portion;

discriminating means, operatively connected to said mixing means, for discriminating the frequency of the output frequency signals from said first mixing means and providing an output signal proportional to a predetermined error frequency component;

means, operatively connected to said mixing means, for extracting an envelope of the non-modulated portion of the output frequency signal from said first mixing means and providing a control signal corresponding to the non-modulated portion, said means for extracting an envelope of the non-modulated portion including:

hybrid means, operatively connected to said first mixing means, for receiving the output frequency signal of said first mixing means and for dividing the output frequency signal into first and second output signals;

second mixing means, operatively connected to said hybrid means, for mixing the first and second output signals with the locally generated signal in phase quadrature with each other so as to provide first and second mixed output signals;

first and second squaring means, operatively connected to said second mixing means, for receiving said first and second mixed output signals, respectively, and providing first and second squared signals, respectively; and adder means, operatively connected to said first and second squaring means, for adding the first and second squared signals and providing a sum signal;

integrating means of a sample-hold type, operatively connected to said discriminating means and said means for extracting an envelope, for integrating the output signal of said discriminating means and holding the output level under the control of said control signal from said means for extracting an envelope of the non-modulated portion and providing an integrated output signal; and a voltage controlled oscillator, operatively connected to said integrating means, for receiving the output signal from said integrating means as a frequency controlled signal and for generating said locally generated signal.

5. A frequency converter, according to claim 4, wherein said means for extracting an envelope of the nonmodulated portion further comprises square root means, operatively connected to said adder means, for receiving the sum signal from said adder means and providing a signal proportional to the envelope of the amplitude of the nonmodulated portion.

6. A frequency converter, according to claim 5, wherein said discriminating means and said means for extracting an envelope of the non-modulated portion commonly include said hybrid means and said second mixing means, connected to said hybrid means, for common use.

7. A frequency converter, according to claim 4, wherein said discriminating means and said means for extracting an envelope of the non-modulated portion commonly include said hybrid means and said second mixing means, connected to said hybrid means, for common use.

8. A frequency converter, operatively connected to receive a modulated burst signal, including a non-modulated portion, from a time division multiple access communication system, said frequency converter comprising:

first mixing means, operatively connected to receive the burst signal from the time division multiple access communication system and to receive a locally generated signal, for mixing the burst signal with the locally generated signal so as to convert the frequency of the burst signal and outputting an output frequency signal having a non-modulated portion;

discriminating means, operatively connected to said mixing means, for discriminating the frequency of the output frequency signal from said first mixing means and providing an output signal proportional to a predetermined error frequency component;

means, operatively connected to said mixing means for extracting an envelope of the non-modulated portion of the output frequency signal from said first mixing means and providing a control signal corresponding to the non-modulated portion, said means for extracting an envelope of the non-modulated portion including:

hybrid means, operatively connected to said first mixing means, for receiving the output frequency signal of said first mixing means and for dividing the output frequency signal into first and second output signals;

second mixing means, operatively connected to said hybrid means, for mixing the first and second output signals with the locally generated signals in phase quadrature with each other to provide first and second mixed output signals;

first and second absolute value means, operatively connected to said second mixing means, for receiving said first and second mixed output signals, respectively, and generating first and second absolute value signals, respectively; and an adder circuit, operatively connected to said first and second absolute value means, for receiving the first and second absolute value signals and for providing a sum signal of said first and second absolute value signals;

integrating means of a sample-hold type, operatively connected to said discriminating means and said means for extracting an envelope, for integrating the output signal of said discriminating means and holding the output level under the control of said control signal from said means for extracting an envelope of the non-modulated portion and providing an integrated output signal; and a voltage controlled oscillator, operatively connected to said integrating means, for receiving the output signal from said integrating means as a frequency controlled signal and for generating said locally generated signal.

9. A frequency converter according to claim 8, wherein said discriminating means and said means for extracting an envelope of the non-modulated portion commonly include said hybrid means and said second mixing means, connected to said hybrid means, for common use.

* * * * *